(12) United States Patent
Aoki et al.

(10) Patent No.: US 6,303,952 B1
(45) Date of Patent: Oct. 16, 2001

(54) CONTACT STRUCTURE WITH AN OXIDE SILICIDATION BARRIER

(75) Inventors: Katsuhiro Aoki, Tsuchiura; Tomoyuki Sakoda; Yukio Fukuda, both of Ibaraki, all of (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/226,238

(22) Filed: Jan. 5, 1999

Related U.S. Application Data

(60) Provisional application No. 60/071,400, filed on Jan. 14, 1998.

(51) Int. Cl.$^7$ ............................................. H01L 29/76
(52) U.S. Cl. .................... 257/295; 257/300; 257/751; 257/764
(58) Field of Search .................. 257/295, 296, 257/300, 751, 764

(56) References Cited

U.S. PATENT DOCUMENTS

| 5,679,980 | * | 10/1997 | Summerfelt | 257/751 |
| 5,744,832 | * | 4/1998 | Wolters et al. | 257/295 |
| 5,773,314 | * | 6/1998 | Jiang et al. | 438/3 |
| 5,777,356 | * | 7/1998 | Dhote et al. | 257/295 |
| 5,892,254 | * | 4/1999 | Park et al. | 257/295 |

OTHER PUBLICATIONS

Ghandhi, S., VLSI Fabrication Principles, John Wiley & Sons, 1983, pp. 437–438.*

* cited by examiner

Primary Examiner—T. N. Quach
(74) Attorney, Agent, or Firm—Jacqueline J. Garner; W. James Brady, III; Frederick J. Telecky, Jr.

(57) ABSTRACT

A ferroelectric capacitor electrode contact structure comprising an insulator (304) placed over a substrate (302), the insulator (304) containing a source plug (310) and a drain contact (312). An upper plug layer (322) is place over and electrically connected to a drain contact (312). A multi-component oxide layer (324) is placed over an upper plug layer (322). A bottom electrode (326) is placed over a multi-component oxide layer 324. Multi-component oxide layer (324) prevents the silicidation of the bottom electrode (326) of a ferroelectric capacitor electrode contact structure while surprisingly maintaining an ohmic contact from the substrate (302) through the drain contact (312) through the upper plug layer (322) through the multi-component oxide layer (324) to the bottom electrode 326.

8 Claims, 3 Drawing Sheets

CONTACT STRUCTURE WITH AN OXIDE SILICIDATION BARRIER

This application claims priority under 35 USC § 119 (e)(1) of provisional application No. 60/071,400, filed Jan. 14, 1998.

TECHNICAL FIELD OF THE INVENTION

This invention relates, in general, to an electrode contact structure containing a silicidation barrier that prevents silicidation of the structure electrode. More specifically, this invention relates to a ferroelectric capacitor electrode contact structure containing an oxide silicidation barrier that prevents silicidation of the structure electrode.

BACKGROUND OF THE INVENTION

Without limiting the scope of the invention, its background is described in connection with use of an oxide silicidation barrier in a ferroelectric capacitor. The ferroelectric dielectrics of such capacitors include lead zirconium titanate (PZT) and barium strontium titanate.

The development of ferroelectric memories has run into some serious problems. One main problem involves the fabrication of the contact between a polysilicon plug and the bottom electrode of a ferroelectric capacitor. Metal electrodes such as Ir, Pt, and Ru are generally applied to such ferroelectric capacitors.

SUMMARY OF THE INVENTION

The simplest structure for an electrode contact would be the placement of a metal electrode, such as Ir and Pt, directly on the polysilicon plug. However, such a structure cannot be used because a silicidation reaction takes place between the bottom electrode and the polysilicon plug when crystalline ferroelectric film ig formed at a temperature greater than 600° C.

Recently, titanium nitride, tantalum nitride, tantalum silicon nitride, and aluminum titanium nitride have been placed between the bottom electrodes and the polysilicon plug. However, such nitride films can be oxidized by oxygen which penetrates through the grain boundary of metal electrodes at high temperatures. Thus, no successful electrode structures have been developed to date.

The present invention involves the placement of a very thin multi-component oxide layer between the ferroelectric dielectric bottom electrode and the silicon-containing plug.

One use of this invention can be to isolate the bottom electrode and the silicon-containing plug by placing a barrier capable of suppressing the silicidation reaction between them while allowing the formation of an ohmic contact by increasing the defect density of natural silicon oxide film by doping with titanium oxide. Surprisingly, this multi-component oxide layer does not prevent the formation of an ohmic contact, even though the oxides are insulators. Also, surprisingly, this oxide layer substantially suppresses the silicidation reaction even though it is very thin.

The ferroelectric capacitor bottom electrode contact structure of the invention can comprise a semiconducting substrate, a via-containing insulator over the semiconducting substrate, a silicon-containing plug in the via-containing insulator, a multi-component oxide layer over the silicon-containing plug, and an electrode over the multi-component oxide layer, wherein a conductive path is routed from the silicon-containing plug to the electrode through the multi-component oxide layer.

The process for fabricating a ferroelectric capacitor bottom electrode contact structure of the invention can comprise the steps of forming at least one silicidation barrier source component on a silicon-containing plug, depositing a bottom electrode over the silicidation barrier source component, and annealing the contact structure.

BRIEF DESCRIPTION OF THE DRAWINGS

For a complete understanding of the present invention, including its features and advantages, reference is now made to the detailed description of the invention taken in conjunction with the accompanying drawings in which like numerals identify like parts and in which.

DETAILED DESCRIPTION OF THE INVENTION

Figure 1:
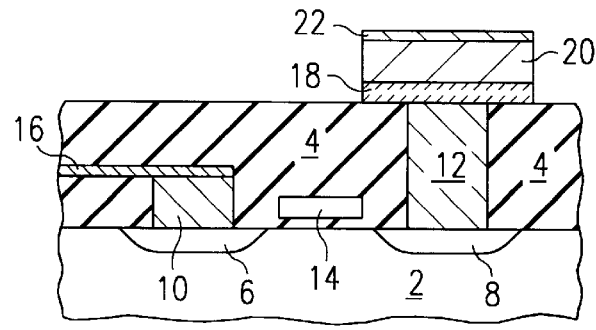
FIG. 1 is a cross-sectional view of a prior art ferroelectric capacitor contact structure.

FIG. 1 shows a simplified cross-section of a prior art contact structure. Insulator 4 is placed over substrate 2. Source 6 and drain 8 are in substrate 2. Insulator 4 contains source 10 and silicon-containing drain contact 12. Source 6 is electrically connected to source plug 10. Drain 8 is electrically connected to silicon-containing drain contact 12. Gate 14 is between source plug 10 and silicon-containing drain contact 12 and is insulated by insulator 4. Metal wiring 16 is electrically connected to source plug 10. Bottom electrode 18 is electrically connected to silicon-containing drain contact 12. PZT (or other high-dielectric constant material) layer 20 is placed over bottom electrode 18. Top electrode 22 is placed over PZT layer 20. It is a key purpose of this invention to provide a silicidation barrier in a contact structure, e.g. between bottom electrode 18 and silicon-containing drain contact 12.

Figure 2A:
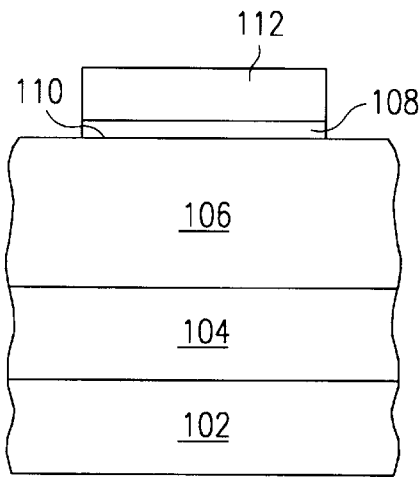
FIGS. 2A and 2B are simplified cross-sectional views of pre- and post-annealed test samples.
Figure 2B:
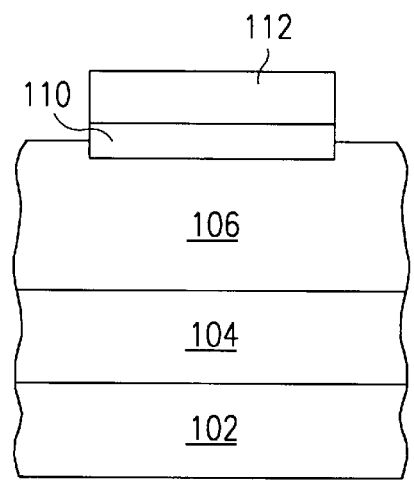

FIGS. 2A and 2B show a cross-sectional representation of a test sample structure before and after the annealing of the multi-component oxide layer.

FIG. 2A represents the pre-annealed test structure. Insulator 104 is placed over substrate 102. Silicon-containing plug material (polysilicon) 106 is placed over insulator 104. Silicidation barrier source-type material (titanium) 108 is placed over silicon-containing plug material 106. Bottom electrode-type material (iridium) 112 is placed over silicidation barrier source material 108.

FIG. 2B shows the product of rapid thermal annealing at 650° C. for 20 sec in oxygen, where multi-component oxide layer (here, silicon oxide/titanium oxide) 110 forms between bottom electrode 112 and silicon-containing plug material 106.

Figure 3A:
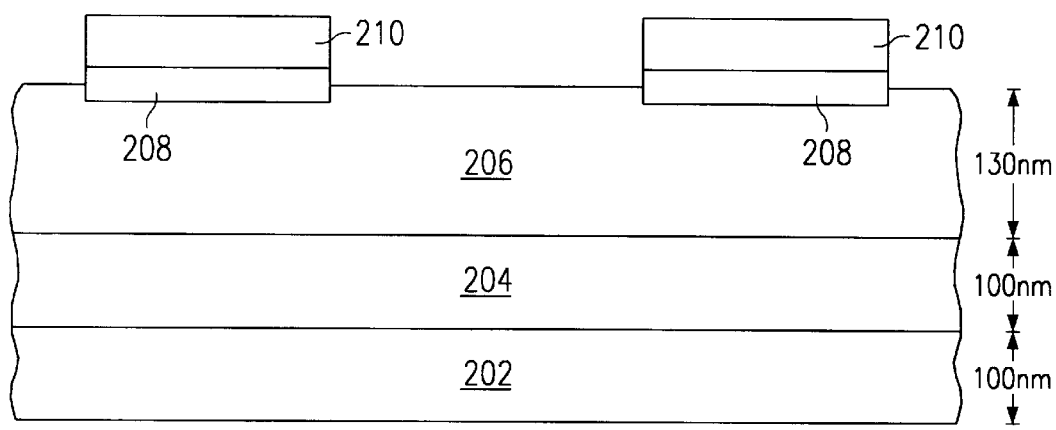
FIGS. 3A and 3B are simplified cross-sectional views of a test sample contact structure of the silicon-containing plug/electrode interface simulating one embodiment of the present invention (Example 1)
Figure 3B:
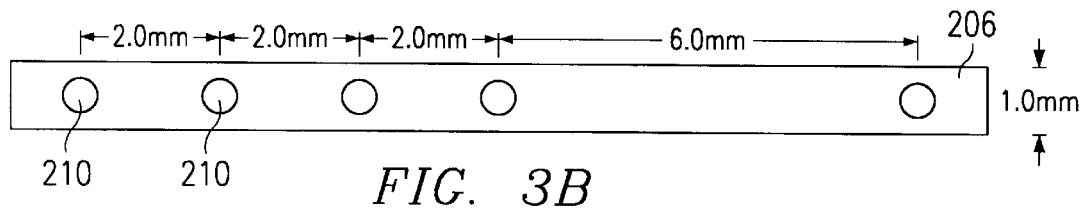

FIG. 3 shows a representation of a test structure containing electrodes 210 electrically connected by silicon-containing plug 206. In FIG. 3A, insulator 204 is on substrate 202. Silicon-containing plug material 206 is placed over insulator 204. Electrode 210 is electrically connected to silicon-containing plug material 206 through multi-component oxide layer 208.

Figure 4:
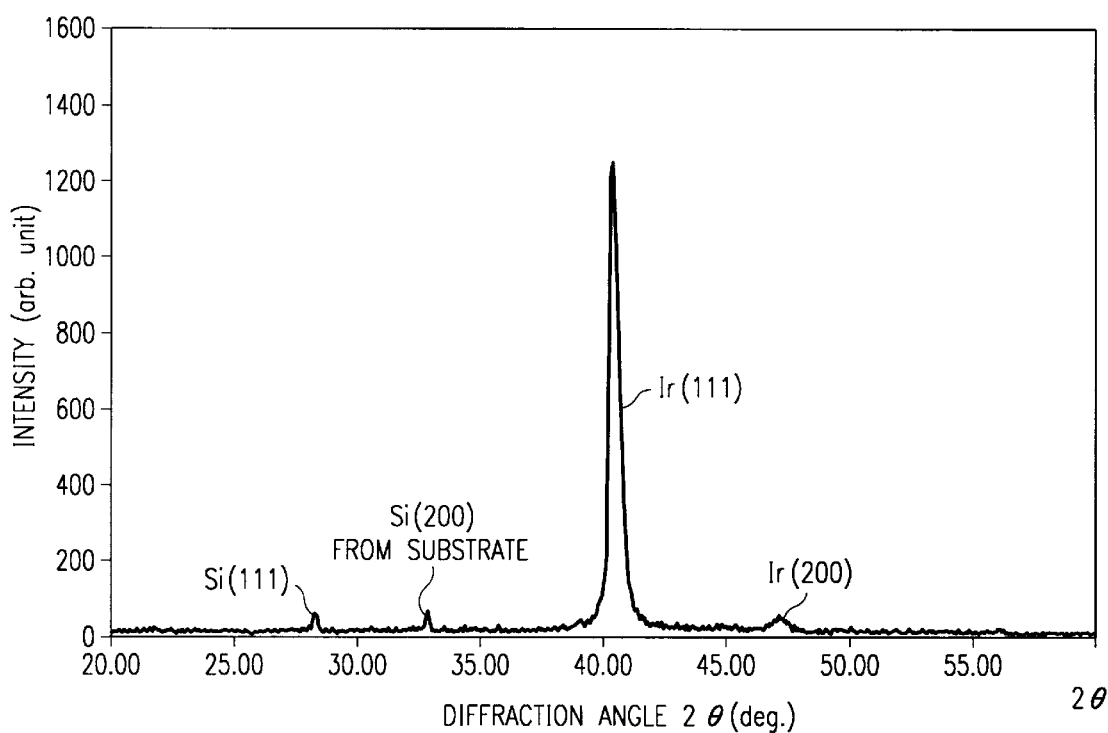
FIG. 4 is a X-ray diffraction pattern from the test sample contact structure of FIG. 2 (Example 1)

FIG. 4 shows the X-ray diffraction patterns of the $Si/SiO_2/$polysilicon/Ti/Ir complex annealed under the above conditions. The diffraction pattern contains only the patterns for iridium and silicon. This shows that no significant silicidation of the iridium took place. Because the $TiO_2$—$SiO_2$ layer is very thin, it does not contribute to the diffraction pattern.

Figure 5:
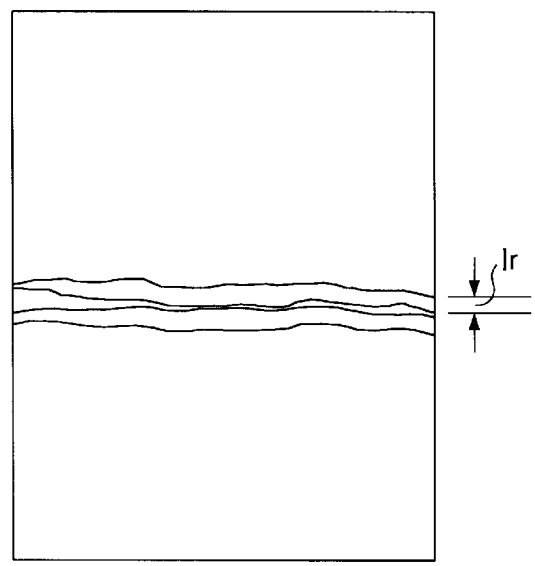
FIG. 5 is a cross-sectional SEM image of the sample contact structure of FIG. 2 (Example 1)

FIG. 5 shows the SEM image of the interface between the iridium and polysilicon plug. This image also shows that the annealing did not produce any significant interaction between the polysilicon and the iridium.

The above results indicate that the annealed test structure has the composition $Si/SiO_2/$polysilicon/$(TiO_2$—$SiO_2)/$—Ir. The thickness of the $TiO_2$—$SiO_2$ layer in this example is estimated to be 2–3 nm.

Figure 6:
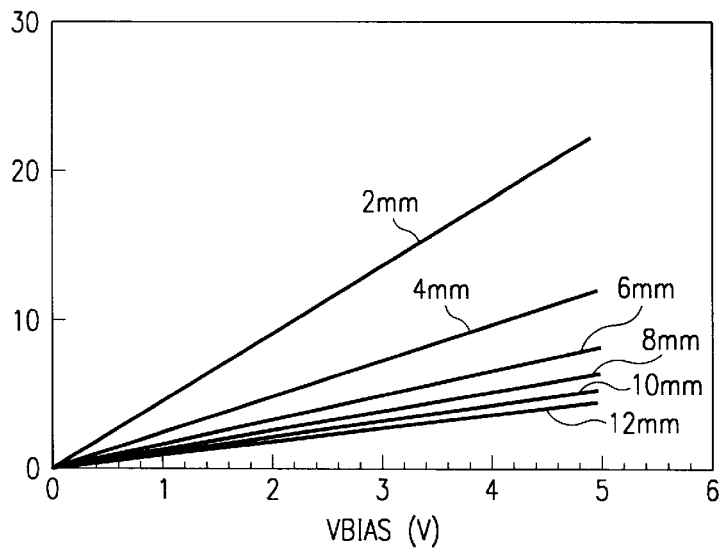
FIG. 6 is a plot of the current (A)–voltage (V) characteristics of the sample contact structure of FIG. 2 (Example 1), the graphs being in terms of current as a function of voltage, for different contact distances.

FIG. 6 shows the current-voltage characteristics measured between differently positioned electrodes. The vertical and horizontal axes indicate the current and applied voltage, respectively. It was found that for each electrode separation distance the current linearly increases proportionally with increasing the applied voltage. Additionally, the current decreases proportionally with increasing distance between the electrodes. These results show that, despite the "normally insulating" $TiO_2$—$SiO_2$ layer, ohmic contacts are formed between the iridium and the polysilicon. The gradient of each current-voltage curve represents the complete resistance including the resistance of the contacts.

Figure 7:
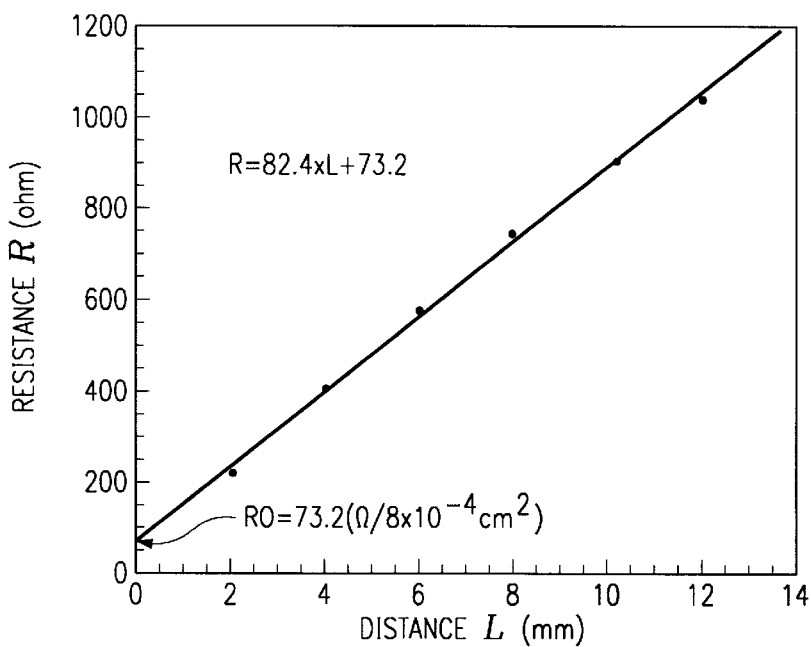
FIG. 7 is a plot of the contact resistance as a function of distance for the sample contact structure of FIG. 2 (Example 1)

FIG. 7 shows the relationship between the resistance (R) and the distance between the electrodes (L). This relationship is expressed by the formula R ($\Omega$)=82×L (mm)+73. Thus, when L=0, the contact resistance ($R_c$) is 73 ($\Omega$)/8× $10^{-4}$ cm$^2$.

Considering such structural issues and the presence of two contacts, the contact resistance (37 $\Omega/\mu m^2$) is quite low. Where the contact structure is applied to a device as shown in FIG. 1, it gives a surprisingly low contact resistance.

Figure 8:
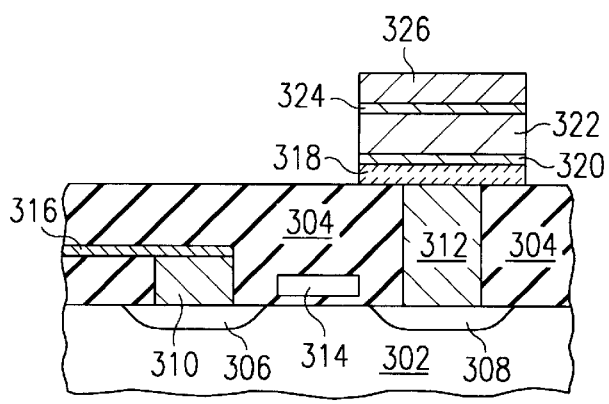
FIG. 8 is a cross-sectional view of a current contact structure with a silicon-containing tungsten plug representing one embodiment of the present invention.

FIG. 8 shows a simplified cross-section of one embodiment of the ferroelectric capacitor contact structure of the invention. Insulator 304 is placed over substrate (e.g. silicon wafer) 302. Source 306 and drain 308 are in substrate 302. Silicon dioxide insulator 304 contains tungsten (or polysilicon) source plug 310 and tungsten (or polysilicon) silicon-containing drain contact 312. Source 306 is electrically connected to source plug 310. Drain 308 is. electrically connected to silicon-containing drain contact 312. Polysilicon gate 314 is between source plug 310 and silicon-containing drain contact 312 and is contained by insulator 304. Metal wiring (e.a. aluminum) 316 is electrically connected to source plug 310. Titanium nitride film barrier 318 is electrically connected to silicon-containing drain contact 312. Titanium layer 320 is placed over titanium nitride film barrier 318. Polysilicon upper plug layer 322 is placed over titanium layer 320. Multi-component oxide layer 324 is placed over upper plug layer 322. Bottom electrode (e.g. iridium) 326 is placed over multi-component oxide layer 324.

While the making and using of various embodiments of the present invention are discussed in detail, it should be appreciated that the present invention provides many applicable inventive concepts which can be embodied in a wide variety of specific contexts. The specific embodiments discussed herein are merely illustrative of specific ways to make and use the invention, and do not delimit the scope of the invention.

Plugs and contacts, such as plug 310 and contact 312, may contain a variety of materials, some examples of which are polysilicon and tungsten. As used herein, with relation to the plug connected to bottom electrode 326, the term "plug" means "a plug, at least a top portion of which is polysilicon." In FIG. 8, the drain contact is made up of drain contact 312, titanium nitride barrier 312, titanium layer 320 and polysilicon upper plug layer 322. In an alternate embodiment, barrier 318 and titanium layer 320 are eliminated and a polysilicon contact 312 could be combined with upper plug layer 322.

The thickness of multi-component oxide layer 208 is preferably between 1 and 10 $\mu$m. This test used iridium, but one skilled in the art recognizes that a large number of different electrode materials work with this invention. Some examples of such electrodes, in addition to iridium, are platinum, ruthenium, palladium, and gold.

Multi-component oxide layer 208 may be formed from a variety of oxidized and non-oxidized materials. Typically, a layer of one silicidation barrier source material (FIG. 1, 108) will be placed between silicon-containing plug 106 and the bottom electrode of a PZT capacitor dielectric. When the contact structure is heated in the presence of oxygen, preferably above 600° C., the silicidation barrier source material and the contacting surface of the silicon-containing plug will form a binary system oxide layer which prevents silicidation between the silicon-containing plug and the bottom electrode. The silicidation barrier source material may be applied as a pure metal, such as titanium, or a mixture of a metal and its oxide, such as titanium and titanium oxide.

It is not necessary for multi-component oxide layer 208 to be limited to a binary system. Multi-component oxide layer 208 may be formed from a multiplicity of oxides.

It is also not necessary for the multi-component oxide layer to be formed from source materials which are heated to form a silicidation barrier. Multi-component oxide layers may be directly deposited using a reactive sputtering process. For example, binary oxides, such as $TiO_2$—$SiO_2$, can be deposited using such a sputtering process.

EXAMPLE

First, a polysilicon plug with thickness of 130 nm is deposited onto a thermally oxidized silicon wafer by the CVD technique. The doping concentration of phosphorus is about $1 \times 10^{20}$ n/cm$^3$. Next, the oxide film on the polysilicon is removed using an HF solution with a concentration of about 0.5 for about 10 minutes. A titanium film (1 nm), and an iridium film (100 nm) are then deposited onto the polysilicon using a metal shadow mask and electron beam evaporator with a base pressure of $8 \times 10^{-8}$ Pa. The deposition area of the metal films is $8 \times 10^{-4}$ cm$^2$. To this point, the fabricated multi-layer test structure is $Si/SiO_2/$polysilicon/ Ti/Ir. The multi-layer test structure is annealed using the same conditions as PZT crystallization annealing. These conditions were 650° C. for 20 sec in an oxygen environment using a rapid thermal annealer. This process forms a very thin $TiO_2$—$SiO_2$ layer between the iridium and polysilicon plug because the titanium and the polysilicon are oxidized by the oxygen which penetrated the grain boundary layer of the iridium. An evaluation sample having a width of 1 mm was cut from the specimen for electrical characterization.

What is claimed is:

1. A ferroelectric capacitor bottom electrode contact structure, comprising:

a semiconducting substrate;

a via-containing insulator over said semiconducting substrate;

a silicon-containing plug in said via-containing insulator;

a multi-component oxide layer, comprising silicon oxide and an insulating oxide of a silicidation barrier source metal, disposed over said silicon-containing plug; and an electrode over said multi-component oxide layer, wherein a conductive path is provided from said silicon-containing plug to said electrode through said multi-component oxide layer.

2. The ferroelectric capacitor bottom electrode contact structure as recited in claim 1, wherein the thickness of said multi-component oxide layer is between 1 and 10 nm.

3. The ferroelectric capacitor bottom electrode contact structure as recited in claim 1, wherein said electrode is selected from the group consisting of iridium, platinum, ruthenium, palladium, gold, and combinations thereof.

4. The ferroelectric capacitor bottom electrode contact structure as recited in claim 1, wherein said oxide of a silicidation barrier source material is titanium oxide.

5. A ferroelectric capacitor bottom electrode contact structure, comprising:

a semiconducting substrate;

a via-containing insulator over said semiconducting substrate;

a silicon-containing plug in said via-containing insulator;

a binary system oxide barrier, comprising silicon oxide and an insulating oxide of a silicidation barrier source metal, disposed over said silicon-containing plug; and an electrode on said binary system oxide barrier, wherein a conductive path is provided from said semiconductor substrate through said silicon-containing plug, through said binary system oxide barrier, to said electrode.

6. The ferroelectric capacitor bottom electrode contact structure as recited in claim 5, wherein the thickness of said binary system oxide barrier is between 1 and 10 nm.

7. A ferroelectric capacitor bottom electrode contact structure as recited in claim 5, wherein said electrode is selected from the group consisting of iridium, platinum, ruthenium, palladium, and gold.

8. The ferroelectric capacitor bottom electrode contact structure as recited in claim 5, wherein the thickness of said binary system oxide barrier is between 1 and 4 nm.

* * * * *